United States Patent
Brunolli (12)

(10) Patent No.: US 6,359,475 B1
(45) Date of Patent: Mar. 19, 2002

(54) HIGH-SPEED, LOW-POWER SAMPLE AND HOLD CIRCUIT

(75) Inventor: Michael J. Brunolli, Escondido, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/650,561

(22) Filed: Aug. 30, 2000

(51) Int. Cl.⁷ .................................................. H03K 5/00
(52) U.S. Cl. ........................................... 327/94; 327/95
(58) Field of Search .............................. 327/90, 91, 93, 327/94, 95, 96, 82, 337, 390; 341/122, 123, 124, 125, 126

(56) References Cited

U.S. PATENT DOCUMENTS

| | | | | |
|---|---|---|---|---|
| 5,081,372 A | * | 1/1992 | Pelgrom ........................ | 327/95 |
| 5,285,115 A | * | 2/1994 | Tsuji ............................ | 327/77 |
| 5,565,812 A | * | 10/1996 | Soenen ........................ | 327/558 |
| 5,847,600 A | * | 12/1998 | Brooks et al. ................. | 330/9 |

* cited by examiner

Primary Examiner—Kenneth B. Wells
Assistant Examiner—Paul Dinh
(74) Attorney, Agent, or Firm—Baker Botts L.L.P.

(57) ABSTRACT

An improved sample and hold circuit for analog-to-digital conversion. The improvement incorporates an asymmetric drive high gain operational amplifier to rapidly slew the input voltage for maintaining a high sample rate. The asymmetric drive high gain operational amplifier allows increased current to be delivered in a uni-directional manner. The input nodes of the high gain operational amplifier are pre-charged to a predetermined reference voltage which further enhances the acquisition time. The asymmetric drive high gain amplifier may be switched off to conserve power consumption.

14 Claims, 5 Drawing Sheets

HIGH-SPEED, LOW-POWER SAMPLE AND HOLD CIRCUIT

FIELD OF THE INVENTION

This invention relates generally to semiconductor devices performing analog-to-digital conversion functions, and, more specifically, to an improved sample and hold circuit for analog-to-digital converters that is both high speed and low power.

BACKGROUND OF THE RELATED TECHNOLOGY

Sample and hold circuits are typically implemented in the acquisition stage of the analog-to-digital conversion process. One such implementation is known in the art as the successive approximation register (SAR) approach. In this approach a sample of the incoming analog signal amplitude is captured and made available to an input node (analog) of a comparator. The second input node of the comparator (high gain amplifier) is connected to a capacitor divider array which in turn is connected to a register. The voltage at the second node is varied by manipulating the stored value of the register until voltage equivalence is achieved. Once the voltage equivalence is achieved the comparator output will change states and the digital equivalent can be captured and stored by the subsequent circuitry.

In a similar architecture, the sampling capacitor is comprised of an array of capacitors and serves a dual purpose. First, during the sampling phase, one side (input) of all the capacitors in the array are connected by switches to the input voltage Vin. Then during the conversion phase, various combinations of the input sides of the capacitor array are connected either low (GND) or high (full scale voltage). At all times the other side (output) of the capacitors are connected to the first node of the comparator. The second node of the comparator is connected to a reference voltage. Again the results of the comparisons control the successive approximation register and thus the switched capacitor array.

Referring to FIG. 1, a sample and hold circuit is designed to capture the voltage amplitude of a slice of the incoming analog signal with the highest fidelity, lowest power and quickest speed possible before the successive approximation occurs. In the prior art, the incoming analog signal, $V_{IN}$, was sampled by means of a switch 10 to create a periodic pulse and then converted to a held signal by a capacitor 20. In this example, capacitor 20 is both the sample capacitor and the switched array as described hereinabove. The hold signal was then sent to an input node of an operational amplifier 30. The second node of the operational amplifier was connected to a reference voltage, which may be the full scale voltage or ground in a bipolar system, or for a single supply device $V_{DD}/2$. A feedback loop 40 was created between the output of the operational amplifier 30 and the analog sample input for zeroing the offset of the amplifier as the input voltage varied. A switch 50 was used to connect the feedback loop 40 at a corresponding time that the sample switch 10 connected the input of the operational amplifier 30 and the input signal, Vin. The output of the operational amplifier was also connected to the successive approximation comparator described hereinabove.

In this regard the prior art was inadequate because rapid acquisition is limited by the slew rate of the operational amplifier. The slew rate of the operational amplifier, i.e., the time it takes the operational amplifier to slew or vary the output from one voltage extreme to another (DV/Dt), is determined in part by the current required to charge the sampling capacitor after switch 10 closes. The undesirable trade off was high power to supply the current necessary to drive the output voltage expeditiously or low power which resulted in undesirably long slew rates. Alternatively, an amplifier can be used with a class AB output stage. The class AB output could relax the slew rate problem. However, it would create a new problem. During the conversion process there often arises circumstances where the amplifier must correctly compare a very small input difference after previously comparing a large input difference of the opposite sign. A low power amplifier with a class AB output stage has a long recovery time in that situation. Thus it is likely that the recovery time would then become the speed limiting factor, rather than the sampling time for this type of analog to digital converter. Therefor, a need exists to provide an improved sample and hold circuit that is capable of rapid acquisition and low power operation.

SUMMARY OF THE INVENTION

The invention overcomes the above-identified problems as well as other shortcomings and deficiencies of existing technologies by providing an improved sample and hold circuit for analog to digital conversion applications, capable of rapid data sample acquisition, and operates at low power.

In accordance with one embodiment of the present invention (see FIG. 2), an improved sample and hold circuit is comprised of an input $V_{IN}$ and a ground potential input GND, an input sampling switch 110 coupled to the input $V_{IN}$, a ground switch 112 coupled to the ground input GND, an input sampling capacitor 120 of the switched array style coupled to the input sampling switch 110, a ground sampling capacitor 122 coupled to the ground switch 122; a first operational amplifier 160 having a first input 168 connected to the input sampling capacitor 120 and to a pre-charge switch 150, and a second input 170 connected to the ground sampling capacitor 122 and to a second pre-charge switch 152; a low power second operational amplifier 130 having a first input 172 connected to the output of the first operational amplifier 160 and a second input 174 connected to the second input 162 of the first operational amplifier 160 (which also is connected to the ground potential capacitor 122), and first and second feedback loops 140, 144 for the second operational amplifier 130 where both the first and second feedback loops 140, 144 are switchable with switches 142 and 146, respectively.

In accordance with another embodiment of the present invention the inputs 168, 170 of the first operational amplifier 160 are pre-charged to a reference voltage, $V_{cm}$, prior to the acquisition of the analog input signal, $V_{IN}$.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
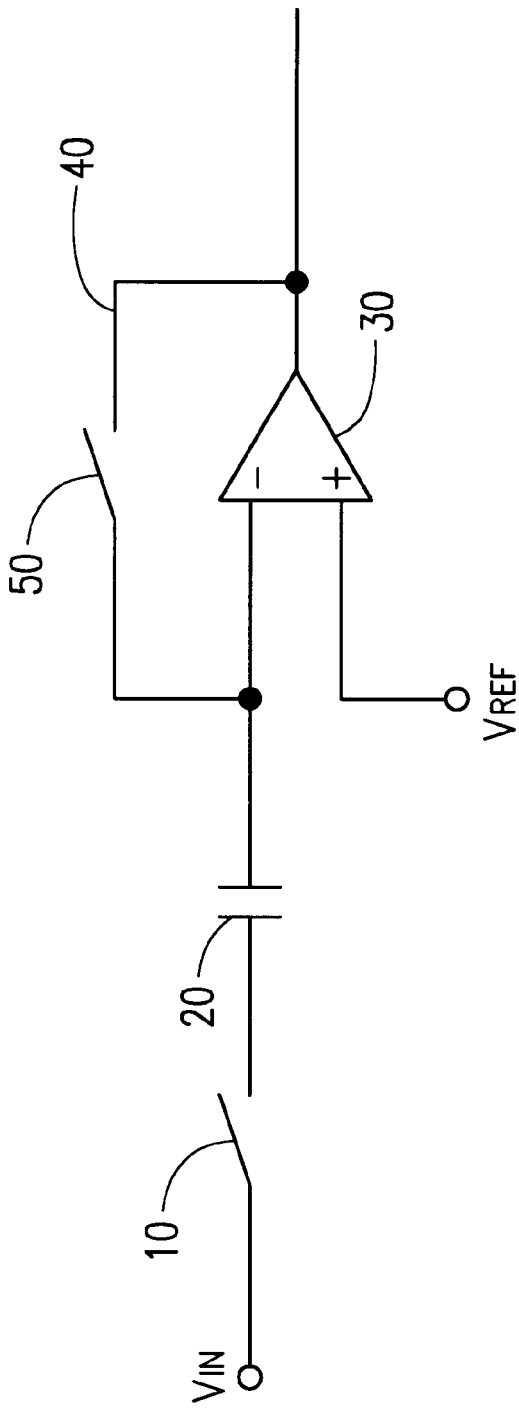
FIG. 1 is a schematic diagram of the prior art.
Figure 2:
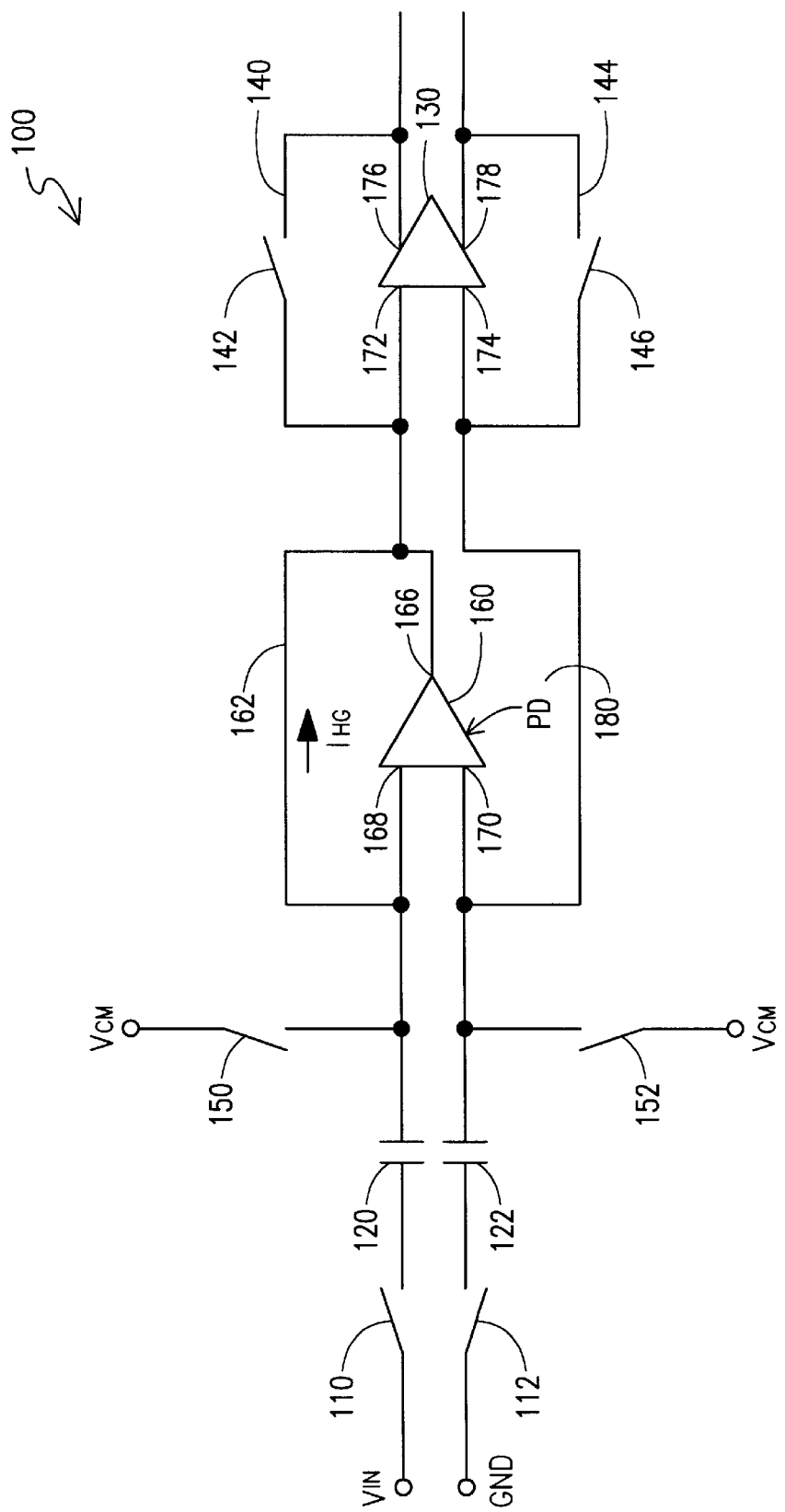
FIG. 2 is a schematic diagram of the present invention.

Referring to FIG. 2, an improved sample and hold circuit for analog to digital conversion applications is illustrated.

The circuit of the present invention, generally indicated by the numeral 100 is comprised of an input $V_{IN}$ and a ground potential input GND, a sampling switch 110 is coupled to the input $V_{IN}$, a ground switch 112 is coupled to the ground input GND, an input sampling capacitor 120 (of the switched array style) is coupled to the input sampling switch 110, a ground sampling capacitor 122 (preferably matched to capacitor 120) is coupled to the ground switch 112, a high gain first operational amplifier 160 having a first input 168 coupled to the input sampling capacitor 120 and to a pre-charge switch 150, and a second input 170 coupled to the ground sampling capacitor 122 and to a second pre-charge switch 152; a feedback loop 162 is connected to an output 166, a second operational amplifier 130, with a lower power consumption than the first operational amplifier 160, has a first input 172 connected to the output 166 of the first operational amplifier 160, and a second input 174 connected to the second input 170 of the first operational amplifier 160. A first feedback loop 140 is connected to a first output 176 of the second operational amplifier 130 and a feedback switch 142, and a second feedback loop 144 is connected to a second output 178 of the second operational amplifier 130 and a feedback switch 146.

The purpose of the pre-charge switches 150 and 152 are to pre-charge the inputs 168, 170 and 172, 174 of the first and second operational amplifiers 160 and 130, respectively, to the reference voltage $V_{cm}$, which is typically, prior to acquisition, $V_{DD}/2$. $V_{DD}/2$ is typically the midpoint of the input signal range for single supply systems. By pre-charging the inputs 168, 170 and 172, 174 to $V_{cm}=V_{DD}/2$, the maximum voltage swing to either rail is limited to ½ the potential swing. Thus, the circuit 100 is initialized for more rapid acquisition over the full spectrum of $V_{IN}$, i.e. ground to $V_{DD}$. The first operational amplifier 160 may be switched off during the pre-charging phase and after acquisition to save power with a power down (PD) function 180.

The purpose of the sampling switch 110 is to capture samples from the incoming analog signal $V_{IN}$. The samples are captured in the form of pulses of a predetermined frequency. The ground switch 112 is operated in unison with the sampling switch 110 so that the appropriate voltage differential is maintained at the inputs of the first and second operational amplifiers 160 and 130, respectively. The second operational amplifier 130 also includes common mode feedback which weakly maintains $V_{cm}$ at its outputs 176, 178.

The sample capacitor 120, which may be a single capacitor or a capacitor array as in the case in many A/D applications, serves to effect a time constant which will hold the sample pulse at the sampled amplitude for a period of time after the pulse is generated. The next pulse will result in charging the capacitor to the new input voltage.

The first operational amplifier 160, first pre-charged to $V_{cm}$, subsequently experiences a voltage differential at the first operational amplifier 160 inputs 168, 170 as a result of the $V_{IN}$ sample. Enhanced by the feedback loop 162, the first operational amplifier 160 develops a slewing current $I_{HG}$ which restores the input of the feedback loop 162 back to $V_{cm}$. The first operational amplifier 160 is typically switched off after the slewing operation in order to save power. A power down (PD) function 180 may be used to disconnect or disable power to the first operational amplifier 160.

Figure 3:
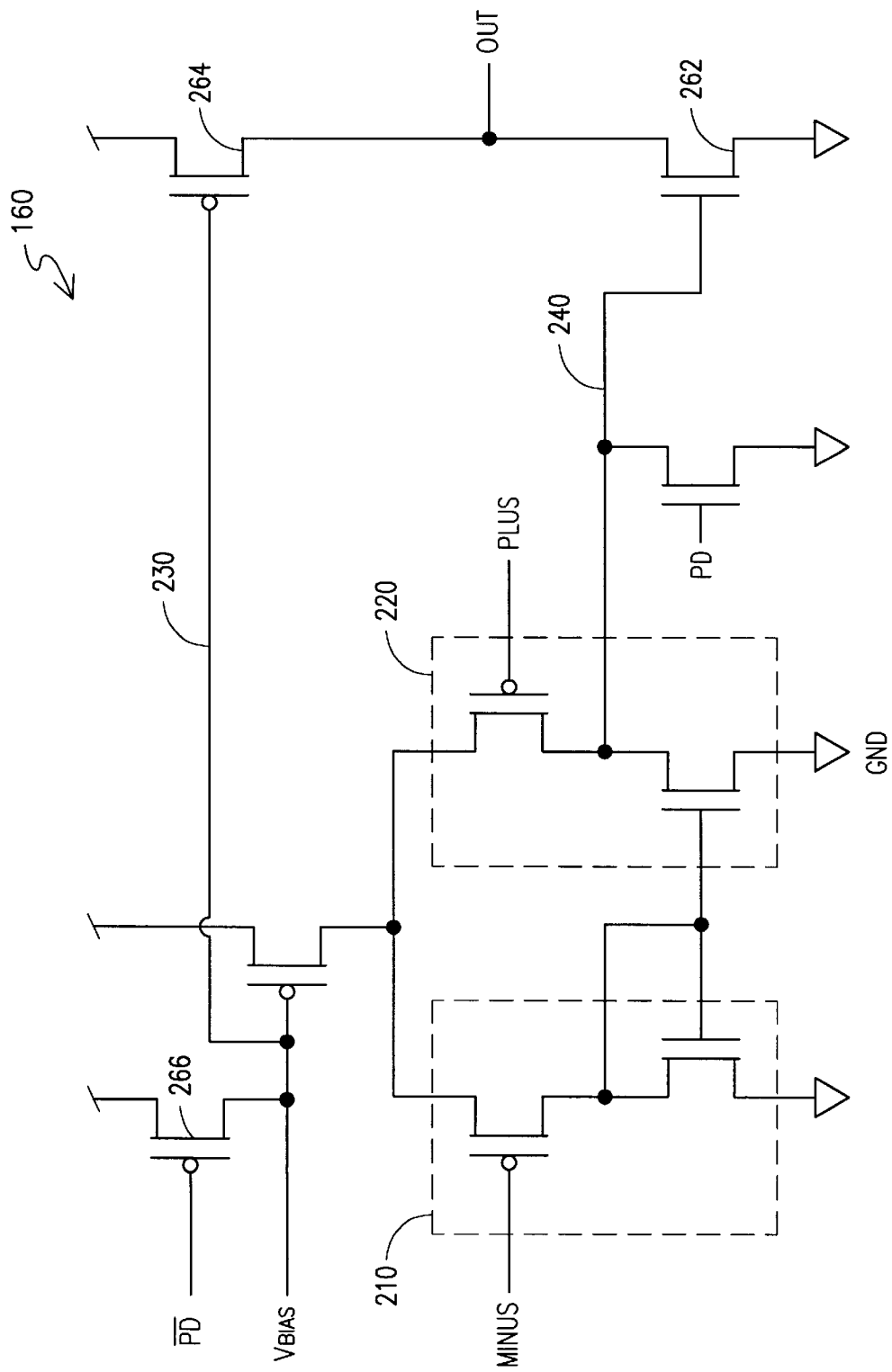
FIG. 3 is a schematic diagram of an asymmetric drive operational amplifier.

Referring to FIG. 3, wherein like numerals represent like elements, first operational amplifier 160 is fabricated such that it is has an asymmetric output drive in the preferred embodiment. This means the first operational amplifier 160 has the capability of delivering more than the bias current in one of either the positive or negative voltage directions under slew rate limited output conditions. The asymmetry of the first operational amplifier 160 is accomplished by the nature of its topology. In the preferred embodiment, the first operational amplifier 160 is asymmetric in the negative. This insures that a high current can be delivered to rapidly slew the inputs of the first operational amplifier 160 to $V_{cm}$. The PD signal when high can pull down node 240, turning off transistor 262. While PD-NOT will cause transistor 266 to turn off transistor 264. Similarly, transistor 266 could be connected in series with transistor 264.

Referring back to FIG. 2, the second operational amplifier 130 receives the output of the first operational amplifier 160. The second operational amplifier 130 serves to convert its differential signal inputs to a comparison signal for use by the remainder of the analog to digital conversion, i.e., the successive approximation register, at a lower power rating than the first operational amplifier 160. The feedback switches 142 and 146 of the second operational amplifier 130 work together with the sampling switches 110 and 112 to enable and zero the offset of the second operational amplifier 130 for the sample pulses.

Figure 4:
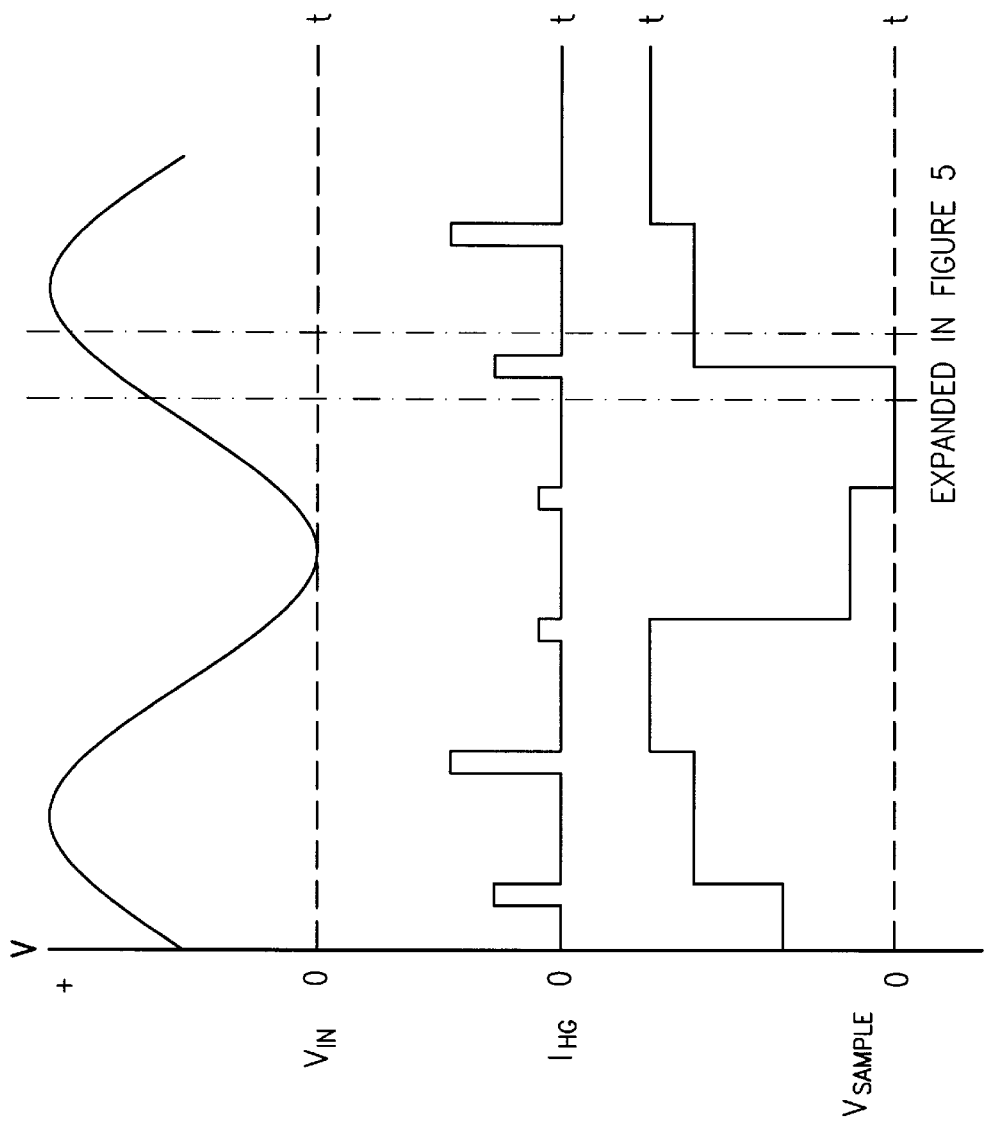
FIG. 4 is a timing diagram of the present invention.

Referring to FIG. 4, a timing diagram for the circuit 100 illustrated in FIG. 2, shows the relationship between $V_{IN}$, $I_{HG}$ (current output of the high gain amplifier 160), and $V_{sample}$ (the voltage stored on capacitor 120). $V_{IN}$ is a typical analog sinusoidal input. $I_{HG}$ is the pulse output of the high gain op amp 160 and reflects the amplified input signal from the sampling capacitors 120 and 122. $V_{sample}$ is the stored value of $V_{IN}$ on the input side of capacitor 120.

Figure 5:
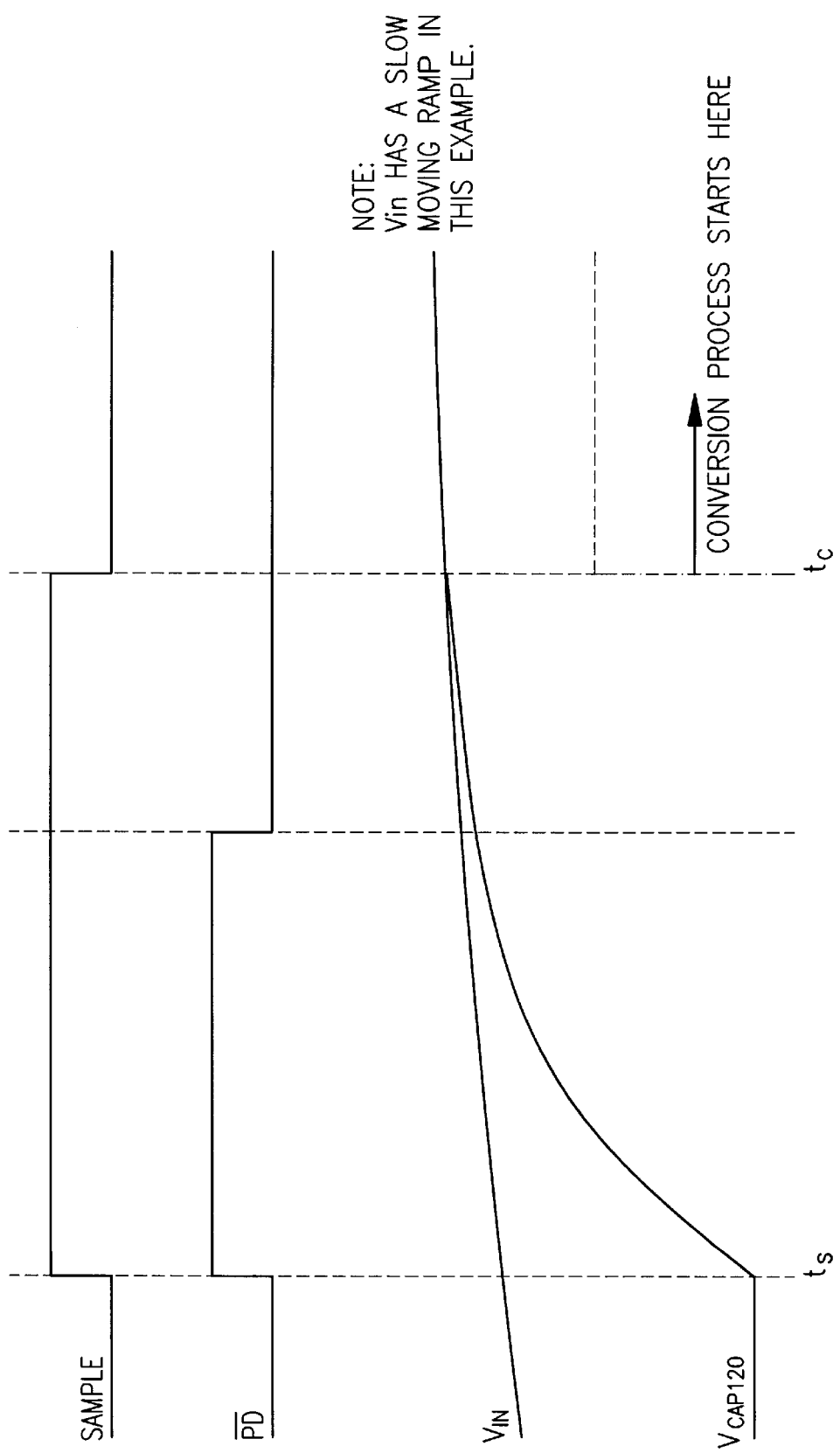
FIG. 5 is a timing diagram of a portion of the timing diagram of FIG. 4.

Referring now to FIG. 5, an expanded view of one of the sample times of FIG. 4 is illustrated. FIG. 5 illustrates the high slew rate of the voltage at the input of the sample capacitor 120 seen at the beginning of the sample period. Amplifier 160 sinks a large current at its output to keep the first input of the amplifier 160 near $V_{cm}$. After amplifier 160 is powered down, the low power amplifier 130 continues to track $V_{in}$ while zeroing out its input offset.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A sample and hold circuit, comprising:
   a first operational amplifier having first and second inputs and an output;
   a second operational amplifier having first and second inputs, and first and second outputs, wherein the first input is connected to the output of the first operational amplifier, the second input is connected to the second input of the first operational amplifier, and the first and second outputs are adapted for connection to an analog-to-digital converter;
   a first switch adapted for connection to an input voltage;
   a second switch adapted for connection to a ground reference;

third and fourth switches adapted for connection to a voltage reference;

a fifth switch connected in a first feedback loop between the first input and first output of the second operational amplifier;

a sixth switch connected in a second feedback loop between the second input and second output of the second operational amplifier;

a first capacitor connected between the first switch and the first input of the first operational amplifier; and a second capacitor connected between the second switch and the second input of the first operational amplifier; wherein, the first switch is connected between the voltage reference and the first capacitor;

the second switch is connected between the ground reference and the second switch;

the third switch is connected between the voltage reference and the first input of the first operational amplifier; and the fourth switch is connected between the voltage reference and the second input of the first operational amplifier.

2. The sample and hold circuit of claim 1, wherein the third and fourth switches are adapted to close periodically so that the voltage reference pre-charges the first and second inputs of the first and second operational amplifiers.

3. The sample and hold circuit of claim 2, wherein the voltage reference is approximately half way between a first and a second voltage.

4. The sample and hold circuit of claim 3, wherein the first voltage is at a power supply voltage and the second voltage is at the ground reference.

5. The sample and hold circuit of claim 2, wherein the first switch is adapted to close periodically so as to cause the first capacitor to store a sample of the input voltage.

6. The sample and hold circuit of claim 5, wherein the second switch is adapted to close periodically with the first switch so as to maintain a differential voltage on the second inputs of the first and second operational amplifiers corresponding to the sample of the input voltage on the first inputs of the first and second operational amplifiers.

7. The sample and hold circuit of claim 6, wherein the fifth and sixth switches close and open when the first and second switches closes and open.

8. The sample and hold circuit of claim 1, wherein the first operational amplifier is powered up to take a sample of the input voltage and is powered down after the sample is taken.

9. The sample and hold circuit of claim 5, wherein the first operational amplifier generates a slewing current which moves the pre-charged voltage reference to the sample of the input voltage.

10. The sample and hold circuit of claim 1, wherein the first operational amplifier has a higher gain than the second operational amplifier.

11. The sample and hold circuit of claim 1, wherein the second operational amplifier draws less power than the first operational amplifier.

12. The sample and hold circuit of claim 1, wherein the first operational amplifier is asymmetric drive.

13. The sample and hold circuit of claim 12, wherein the first operational amplifier is asymmetric drive in a position direction.

14. The sample and hold circuit of claim 12, wherein the first operational amplifier is asymmetric drive in a negative direction.

* * * * *